US012628670B2

(12) United States Patent
Vitic et al.

(10) Patent No.: US 12,628,670 B2
(45) Date of Patent: May 12, 2026

(54) RADIO FREQUENCY (RF) INTERCONNECT CONFIGURATION FOR SUBSTRATE AND SURFACE MOUNT DEVICE

(71) Applicant: CIENA CORPORATION, Hanover, MD (US)

(72) Inventors: Michael Vitic, Chelsea (CA); Maxime Jacques, Montreal (CA); Raphaël Beaupré-Laflamme, Québec (CA)

(73) Assignee: CIENA CORPORATION

( * ) Notice: Subject to any disclaimer, the term of this patent is extended or adjusted under 35 U.S.C. 154(b) by 541 days.

(21) Appl. No.: 18/177,805

(22) Filed: Mar. 3, 2023

(65) Prior Publication Data

US 2024/0297105 A1 Sep. 5, 2024

(51) Int. Cl.
| | |
|---|---|
| *H10W 70/63* | (2026.01) |
| *H10W 20/00* | (2026.01) |
| *H10W 20/20* | (2026.01) |
| *H10W 70/05* | (2026.01) |
| *H10W 72/00* | (2026.01) |

(Continued)

(52) U.S. Cl.
CPC ....... *H10W 70/635* (2026.01); *H10W 20/023* (2026.01); *H10W 20/20* (2026.01); *H10W 70/095* (2026.01); *H10W 72/879* (2026.01); *H10W 90/00* (2026.01); *H10W 72/07554* (2026.01); *H10W 72/244* (2026.01); *H10W 72/252* (2026.01); *H10W 72/536* (2026.01); *H10W 72/5363* (2026.01); *H10W 72/5445* (2026.01); *H10W 72/5473* (2026.01); *H10W 72/884* (2026.01); *H10W 90/724* (2026.01);

*H10W 90/734* (2026.01); *H10W 90/753* (2026.01); *H10W 90/755* (2026.01)

(58) Field of Classification Search
None
See application file for complete search history.

(56) References Cited

U.S. PATENT DOCUMENTS

| | | | |
|---|---|---|---|
| 5,598,031 A * | 1/1997 | Groover ................ | H01L 23/057 257/676 |
| 8,030,722 B1 * | 10/2011 | Bolognia ............. | B81B 7/0061 257/659 |

(Continued)

OTHER PUBLICATIONS

"International Search Report and Written Opinion for Application No. PCT/US2024/017839", Jul. 1, 2024, 11 pages.

(Continued)

*Primary Examiner* — Cory W Eskridge
(74) *Attorney, Agent, or Firm* — Guntin & Gust, PLC; Andrew Gust

(57) ABSTRACT

Aspects of the subject disclosure may include, for example, system, comprising a substrate having an interconnect in or on a surface of the substrate, a riser disposed over the surface, the riser being configured with one or more through riser vias for coupling to the interconnect, a device positioned over the surface, the device having one or more conductive contacts residing in a plane of the device, and one or more wire bonds coupling the one or more through riser vias with the one or more conductive contacts thereby enabling connectivity of the interconnect to be raised toward or to the plane of the device such that at least one of the one or more wire bonds has a limited physical length. Other embodiments are disclosed.

20 Claims, 16 Drawing Sheets

(51) Int. Cl.
    *H10W 90/00*        (2026.01)
    *H10W 72/20*        (2026.01)
    *H10W 72/50*        (2026.01)

(56)            References Cited

U.S. PATENT DOCUMENTS

| | | | |
|---|---|---|---|
| 2004/0022476 | A1 | 2/2004 | Kirkpatrick et al. |
| 2016/0293575 | A1* | 10/2016 | Liu ..................... H01L 25/0652 |
| 2021/0313283 | A1* | 10/2021 | Wilson .................... H01L 23/66 |
| 2022/0302008 | A1* | 9/2022 | Yen ....................... H01L 25/105 |

OTHER PUBLICATIONS

"PCT/US2024/017839 International Preliminary Report on Patentability", Sep. 18, 2025, 8 pgs.

\* cited by examiner

106 / 116 / 126 / 136 e.g., 106r

105

104

142

105

102 y

140

WIRE BOND — 105

INTEGRATED CIRCUIT — 104 e.g.,
ELECTRICAL INTERFACE PAD (METAL) — 104c

ADHESIVE — 104a

SUBSTRATE — 102 e.g.,
THROUGH-SILICON VIA
OR THROUGH-GLASS VIA — 106v

106 / 116 / 126 / 136

102 e.g., 102p
SUBSTRATE PAD (METAL)

SOLDER — 106e

COPPER PILLAR — 106p

RF WIRE BOND_ INTERPOSER
e.g., substrate 106r e.g.,
REDISTRIBUTION LAYER (METAL) — 106t

144

102

104 requires longer
wire bonds

150

150

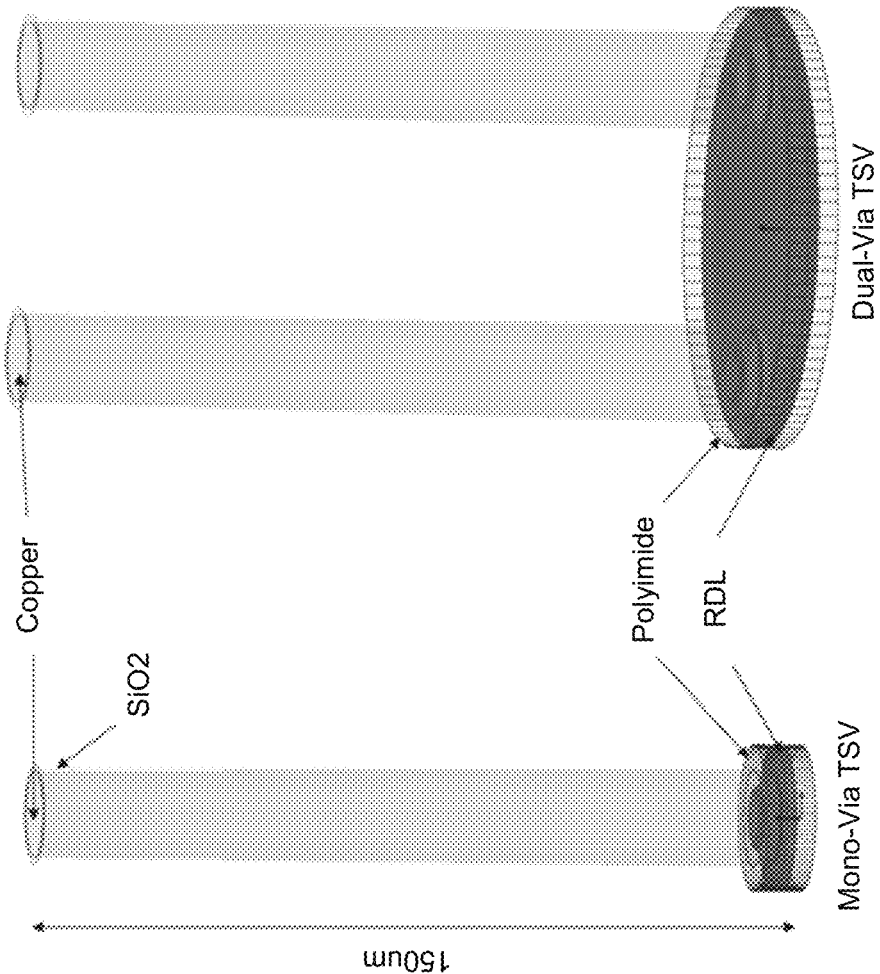
FIG. 1K

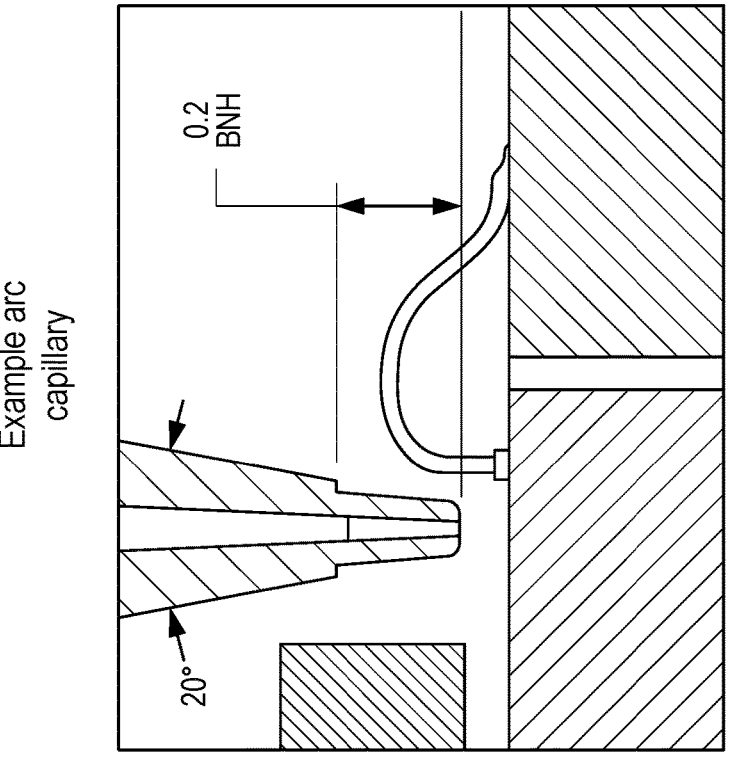
Example arc capillary
20°
0.2 BNH
*FIG. 1M*
Ball and stitch wire bond loop profiles and lengths where there is a height mismatch
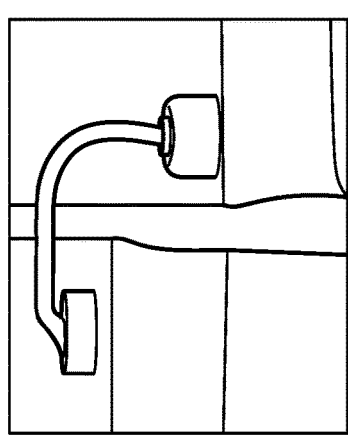
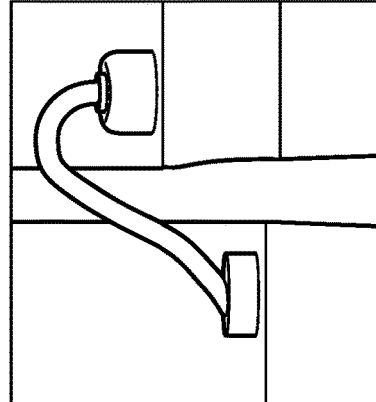

Ball and stitch wire bond loop profile and length where there is no height mismatch Views of example
wedge bond tool Wedge bond loop
profiles and lengths

FIG. 10

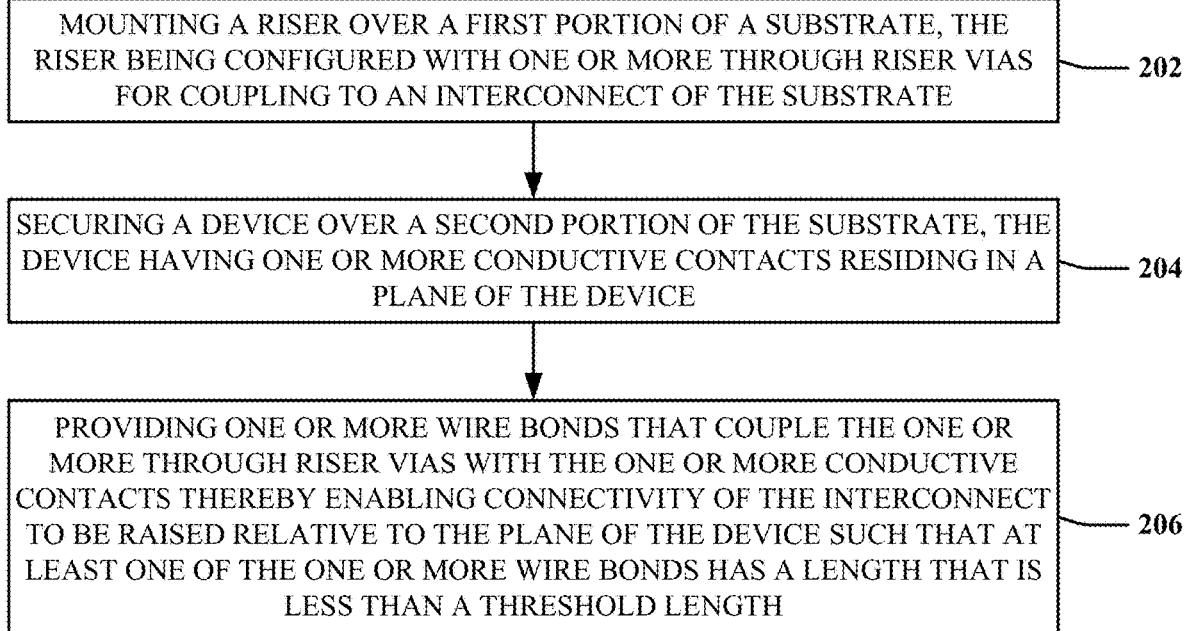

MOUNTING A RISER OVER A FIRST PORTION OF A SUBSTRATE, THE RISER BEING CONFIGURED WITH ONE OR MORE THROUGH RISER VIAS FOR COUPLING TO AN INTERCONNECT OF THE SUBSTRATE —— 202

SECURING A DEVICE OVER A SECOND PORTION OF THE SUBSTRATE, THE DEVICE HAVING ONE OR MORE CONDUCTIVE CONTACTS RESIDING IN A PLANE OF THE DEVICE —— 204

PROVIDING ONE OR MORE WIRE BONDS THAT COUPLE THE ONE OR MORE THROUGH RISER VIAS WITH THE ONE OR MORE CONDUCTIVE CONTACTS THEREBY ENABLING CONNECTIVITY OF THE INTERCONNECT TO BE RAISED RELATIVE TO THE PLANE OF THE DEVICE SUCH THAT AT LEAST ONE OF THE ONE OR MORE WIRE BONDS HAS A LENGTH THAT IS LESS THAN A THRESHOLD LENGTH —— 206

RADIO FREQUENCY (RF) INTERCONNECT CONFIGURATION FOR SUBSTRATE AND SURFACE MOUNT DEVICE

FIELD OF THE DISCLOSURE

The subject disclosure relates to an RF interconnect configuration for a substrate and a surface mount device.

BACKGROUND

Devices, such as electro-optic transmitters, such as Mach-Zehnder modulators, or opto-electric receivers, such as Intradyne Coherent Receiver (ICR) chips, are typically electrically coupled to a substrate via wire bonding. This provides an RF connection between the optical device and the substrate for data signal transfer.

BRIEF DESCRIPTION OF THE DRAWINGS

Reference will now be made to the accompanying drawings, which are not necessarily drawn to scale, and wherein:

FIG. 1K illustrates different units of through riser vias in accordance with various aspects described herein.

FIG. 1M illustrates example height mismatches between two components as well as corresponding resulting ball and stitch wire bonds formed using an arc capillary of particular dimensions in accordance with various aspects described herein.

FIG. 1O illustrates example wedge bond loop profiles and lengths and an example wedge bond tool in accordance with various aspects described herein.

FIG. 2 depicts an illustrative embodiment of a method in accordance with various aspects described herein.

DETAILED DESCRIPTION

Figure 1A:
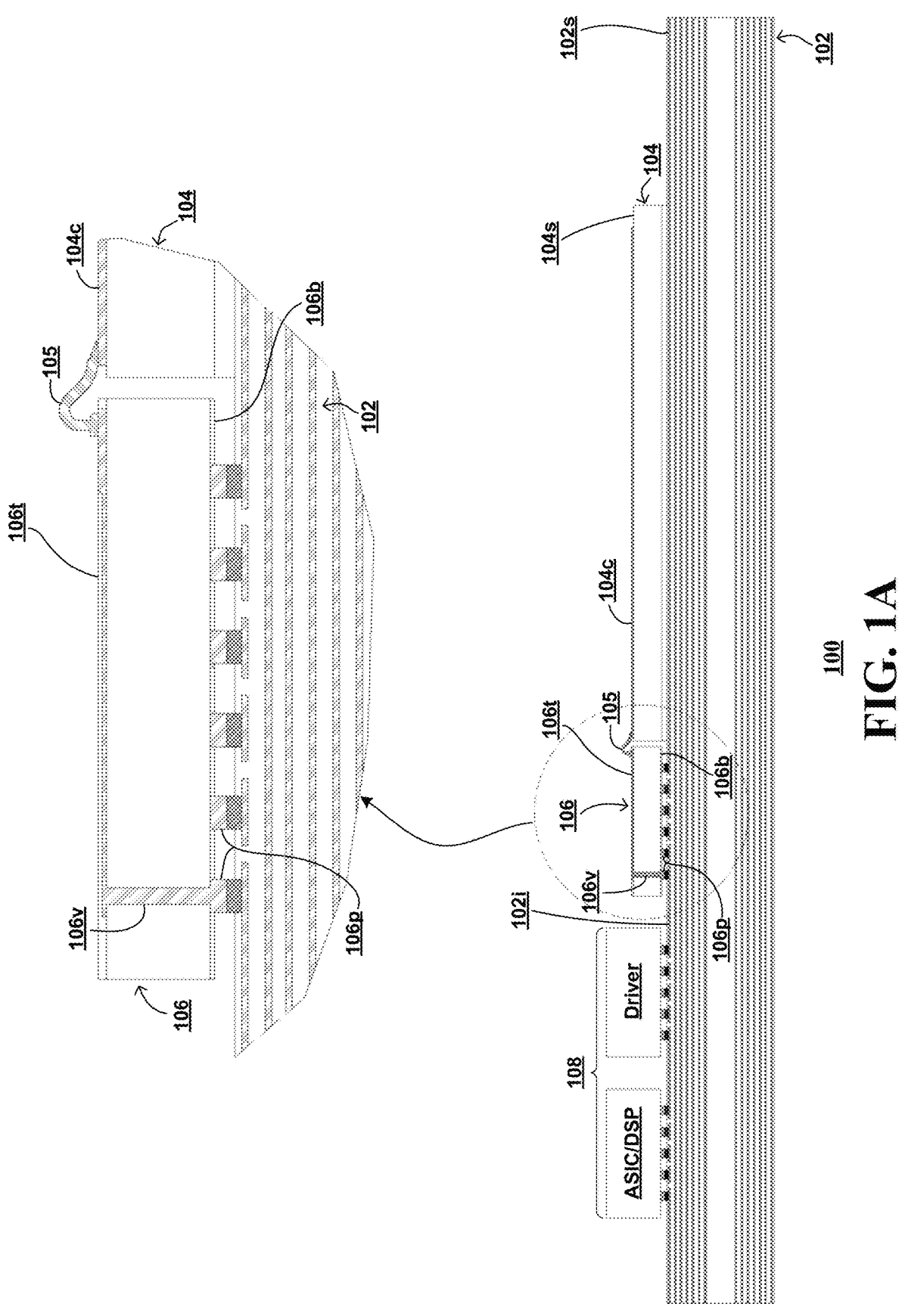
FIG. 1A is a block diagram illustrating an example, non-limiting embodiment of a system configuration in accordance with various aspects described herein.

In a high frequency application space (e.g., 65 gigahertz (GHz) or higher), wire bonds that are too physically long can lead to increased inductance, which can "choke" (or negatively impact) the high frequency data. Long wire bonds can also contribute to degraded channel to channel isolation, i.e. crosstalk between neighboring channels. Typically, transmitters and receivers are configured in quads or octals (i.e., Quad Parallel Mach-Zehnder (QPMZ)), where these arrays of transmitters and receivers are on a 450 micron (um), 500 um, or 625 um channel pitch. To achieve lower manufacturing costs of pluggable transceivers as well as improved throughput (i.e., increased parallelization or Baud rate), the hierarchy within devices is becoming more flattened. Turning a pluggable device into an optical configuration in this way can eliminate discrete optical-to-electrical (O-E)/electrical-to-optical (E-O) packages. This does not come without challenges, however, since, in the case of a transmitter thin-film lithium niobate (TFLN) modulator, the modulator must be directly interfaced to a transceiver printed circuit board (PCB) as opposed to being implemented in its own package with interfaces via pins or a flex.

An existing technique involves simply mounting a transmitter TFLN modulator onto a top surface of a PCB. This unfortunately results in prohibitively long wire bonds for high frequency and high Baud operation.

Another technique is to use controlled-depth mechanical or laser routing where several top layers of dielectric and metal are removed from the PCB while preserving the PCB backside real estate. The challenge with this technique is the difficulty in accurately routing the edges. Particularly, the edge of die becomes "pushed away" from the transmitter TFLN modulator and thus similarly results in prohibitively long wire bonds for high frequency and high Baud operation. For instance, in a case where the slope of the edge is about 15 degrees and the wire bond pad registration tolerance is about ±50 microns (um), the wire bond length can be larger as compared to other conventional interfaces by more than a hundred microns.

As another option, the transmitter TFLN modulator may be positioned in a cut-out of a PCB transceiver board and wire bonded directly to the board. However, the repercussions of such an interfacing technique is that a large cut-out is required as well as fine precision mechanical routing in order for the bonding wires to be as short as possible for high frequency operation. Such routing through a cavity also reduces the available real estate on the backside of the transceiver PCB, which significantly reduces the available space for supporting electronics, especially in the context of tunable coherent optics which are considerably more complex than fixed wavelength intensity modulation (IM)/direct detection (DD).

The subject disclosure describes, among other things, illustrative embodiments of an interconnect scheme in which an RF interconnect for a surface mount or flip-chip integrated passive or active device is raised toward or to the plane of a surface mount E-O or O-E transmitter or receiver so as to enable short wire bonds (or, in other words, wire bonds of limited physical length). In exemplary embodiments, the interconnect scheme may be provided by way of a riser that is bumped on one side to facilitate surface mounting of the riser onto a substrate (e.g., an organic substrate, such as a PCB) or a substrate-like PCB (SLP), and that includes one or more integrated through riser vias that facilitate "raising" of RF from a bottom or underside portion of the substrate toward or to a top side of the surface mount or flip-chip integrated passive or active device, enabling the use of wire bonds of limited physical length.

The height of the riser may be chosen such that a top surface portion of the riser (e.g., exactly) matches a top plane of the surface mount E-O or O-E transmitter or receiver in height or such that a top surface portion of the riser is slightly higher than or slightly lower than (e.g., within a threshold distance from) a height of the top plane of the surface mount E-O or O-E transmitter or receiver. The choice of the relative heights of the riser and the surface mount E-O or O-E transmitter or receiver may depend at least in part on a desired bonding technique for the wire bonds, as described in more detail below.

The RF riser may be composed of any suitable material or any material system. For example, the riser may be composed of glass (e.g., high purity fused silica (HPFS), photo imageable/definable glass in the lithium-aluminum silicate family, and/or the like), ceramic material (e.g., high temperature cofired multilayer ceramics (HTCC), low temperature cofired multilayer ceramics (LTCC), thin-film aluminum nitride (AlN), thin-film aluminum oxide ($Al_2O_3$), and/or the like), a semiconductor material (e.g., silicon, etc.), active materials/devices (e.g., complementary metal-oxide semiconductor (CMOS), bipolar CMOS (BiCMOS), silicon germanium (SiGe), indium phosphide (InP), gallium arsenide (GaAs), and/or the like), quartz, etc., or a combination of some or all of these materials. Other types of materials or combination of materials can be used to form the riser.

The riser may include additional passive elements, inductors, capacitors, transformers, transmission lines, and/or any transformations thereof. The riser may additionally, or alternatively, include active devices, such as amplifiers, boosters, and/or the like. In exemplary embodiments, the riser may be composed of a silicon substrate in which through silicon vias (TSVs) are geometrically configured to provide desired impedance throughout the substrate. The riser may additionally, or alternatively, be composed of glass in which through glass vias (TGVs) are geometrically configured. Various implementations or configurations of a riser are described in more detail below. Again, it is to be understood and appreciated that any material system can be used to form the riser.

Providing an interconnect scheme between a substrate and a surface mount E-O or O-E transmitter or receiver, as described herein, allows for the use of a differential-output driver with E-O crystal Mach-Zehnder modulators (MZMs), which, as compared to single-ended driving of those same modulators, enables improved signal integrity for the traveling wave (TW)-MZM as well as improved signal-to-noise ratio (SNR) and thus better achievable propagation distance or modulation format complexity (i.e., higher throughput). The RF interconnect scheme also helps to de-risk system designs such that certain through silicon vias may be avoided, thus alleviating stress-related issues on optical waveguides, multi-mode interferometers (MMIs), and flip-chips (since there are significant stresses introduced in the metallization and bumps due to the thermal expansion coefficient between silicon and an organic substrate—i.e., 2-3 parts per million (ppm)/° C. versus 20 ppm/° C.). For instance, vias (e.g., TSVs, etc.) can be advantageously avoided in the active device. Additionally, the RF interconnect scheme can allow for the chip to be bonded with a flexible adhesive, which is beneficial as compared to the rigidity of a flip chip attach.

Exemplary embodiments of the riser allow for patterning of through riser vias (e.g., TSVs in a case where the riser is composed of silicon) such that (e.g., copper) redistribution layers (RDLs) can be employed on both sides of a given through riser via to "massage" (or adjust) a capacitance-inductance-capacitance (CLC) network, thereby improving the bandwidth and return loss beyond what would be achievable solely with wire bonds, especially when the length from ball to stitch or stitch to stich (wedge/wedge) is beyond 150 um and at the limit of tolerancing (i.e., comparing the tolerancing of lithography versus a mechanical wire bonder). It is to be understood and appreciated that the riser may or may not employ (e.g., copper) redistribution layer(s).

In a case where the riser is an integrated passive device, the capacitance and inductance on both the board side and the wire bond side can be adjusted or customized. Adding additional through riser vias can aid in managing the inductance. Furthermore, transmission lines (e.g., 50 ohm) or any form of RF transformation can be added in between to further adjust or customize the signaling.

One or more aspects of the subject disclosure include a system. The system may include a substrate having an interconnect in or on a surface of the substrate. The system may also include a riser disposed over the surface, the riser being configured with one or more through riser vias for coupling to the interconnect. The system may also include a device positioned over the surface, the device having one or more conductive contacts residing in a plane of the device. The system may also include one or more wire bonds coupling the one or more through riser vias with the one or more conductive contacts thereby enabling connectivity of the interconnect to be raised toward or to the plane of the device such that at least one of the one or more wire bonds has a limited physical length.

One or more aspects of the subject disclosure include a riser. The riser may include a body and one or more pillars or solder bumps on an underside of the body for facilitating mounting of the riser to a substrate. Further, the riser may include one or more vias defined in the body and coupled to the one or more pillars or solder bumps, wherein mounting of the riser to the substrate enables connectivity of an interconnect of the substrate to be raised toward or to a plane of a device disposed over the substrate such that a wire bond for electrical coupling of the riser and the device has a length that is less than a threshold length.

One or more aspects of the subject disclosure include a method. The method may include mounting a riser over a first portion of a substrate, the riser being configured with one or more through riser vias for coupling to an interconnect of the substrate. Further, the method may include securing a device over a second portion of the substrate, the device having one or more conductive contacts residing in a plane of the device. Further, the method may include providing one or more wire bonds that couple the one or more through riser vias with the one or more conductive contacts thereby enabling connectivity of the interconnect to be raised relative to the plane of the device such that at least one of the one or more wire bonds has a length that is less than a threshold length.

Other embodiments are described in the subject disclosure.

Referring now to FIG. 1A, a block diagram is shown illustrating an example, non-limiting embodiment of a system configuration 100 in accordance with various aspects described herein. The system configuration 100 is implemented with an interconnect scheme in which an RF or electrical interconnect (102i) of a substrate is raised toward or to a plane of a device, thereby enabling short wire bonding. As shown in FIG. 1A, the system configuration 100 may include a substrate/board 102, a device 104, a riser 106, and one or more processing/driver/memory components 108 disposed on a surface 102s of the substrate 102. The substrate 102 may be an organic substrate, such as a multi-layer laminate/PCB or an SLP. The device 104 may be a photonic chip. For instance, the device 104 may be a transmitter E-O modulator (TFLN) or a receiver O-E modulator. Alternatively, the device 104 may be another type of device. For example, the device 104 may be a trans-impedance amplifier, a sensor, another wire bondable device, or a combination of some or all of these devices. The device 104 may be mounted onto the substrate 102 in any suitable manner, such as via an adhesive (e.g., glue) or the like. The device 104 may include contact(s) 104c (on a surface 104s) as well as one or more other components, such as, a traveling wave electrode disposed on or coupled to the contact(s) 104c. As shown in FIG. 1A, wire bond(s) 105 may electrically couple the contact(s) 104c of the device 104 with a top redistribution layer 106t of the riser 106.

The riser 106 may be composed of one or more of the materials described above. In exemplary embodiments, the riser 106 may be composed of silicon. As shown in FIG. 1A, the riser 106 may be defined with through riser via(s) 106v coupled to the top redistribution layer 106t and a bottom redistribution layer 106b. The riser 106 may also include pillar(s) 106p on an underside of the riser 106. In exemplary embodiments, the pillar(s) 106p may be composed of copper and/or any other type of electrically conductive material (e.g., tungsten, aluminum, gold, etc.). In various embodiments, the riser 106 may be fabricated with the pillar(s) 106p. For instance, the pillar(s) 106p may be "grown" on a bottom surface of the riser 106. In certain embodiments, the riser 106 may alternatively include controlled-collapse chip connect (C4)—i.e., solder bumps—as elements 106p. As shown in FIG. 1A, the riser 106 may be in the form of an integrated passive device (IPD) that raises the RF plane from the board 102 toward or to a plane (or height) of the device 104. This brings the RF signal toward or to the height of the device 104, which enables shorter wire bonds and thus reduced or minimized losses.

In one or more embodiments, the riser 106 may be configured as a bumped component. For instance, the riser 106 may be configured as a ball grid array (BGA) component for surface mounting (e.g., via soldering) onto the substrate 102. This enables assembly of the riser 106 and the substrate 102 via a standard pick and place procedure as well as standard refloat processing. It is to be understood and appreciated that system configurations involving risers of other constructions are also possible.

Figure 1B:
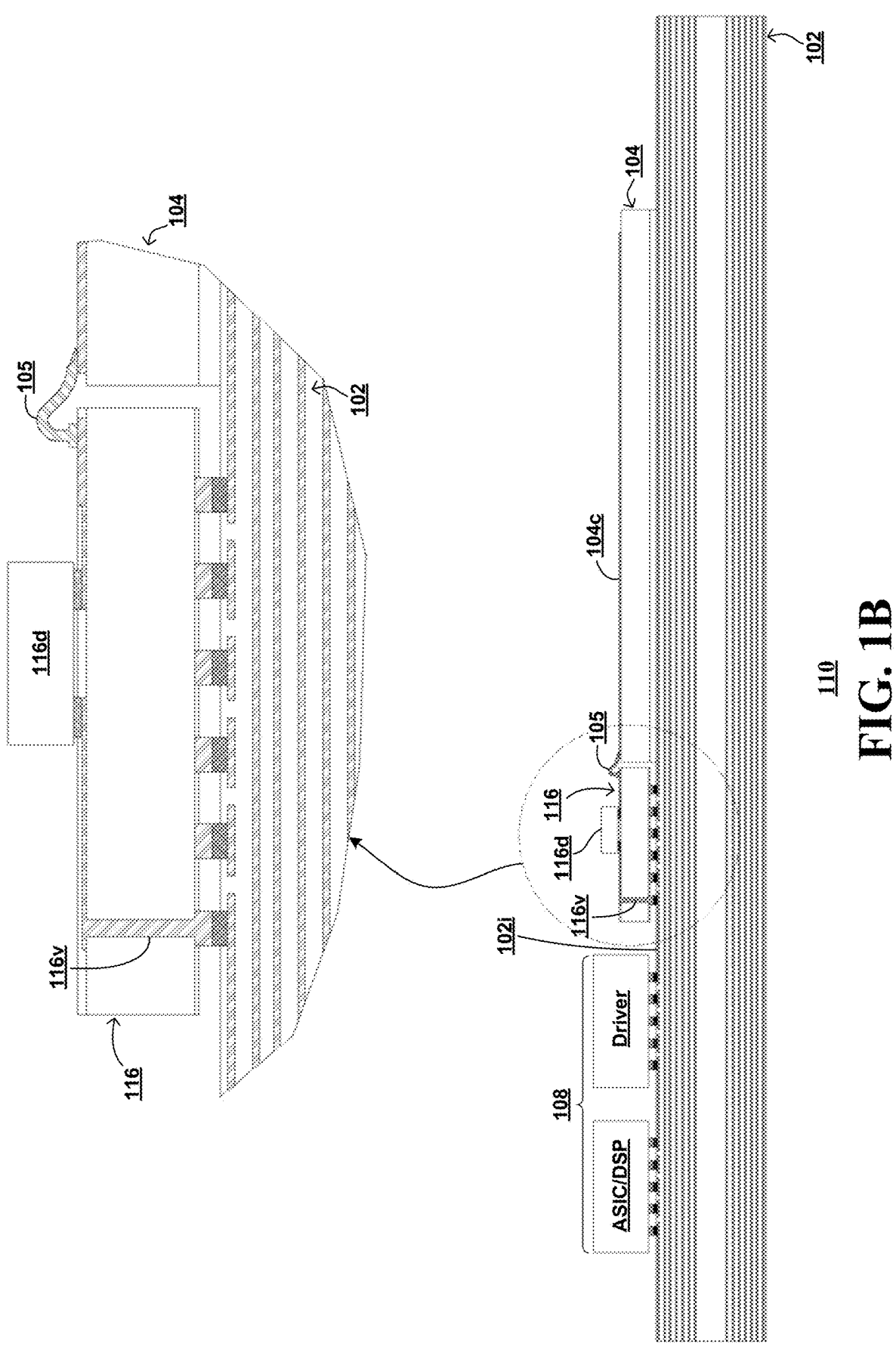
FIGS. 1B-1D are block diagrams illustrating other example, non-limiting embodiments of the system configuration in accordance with various aspects described herein.
Figure 1C:
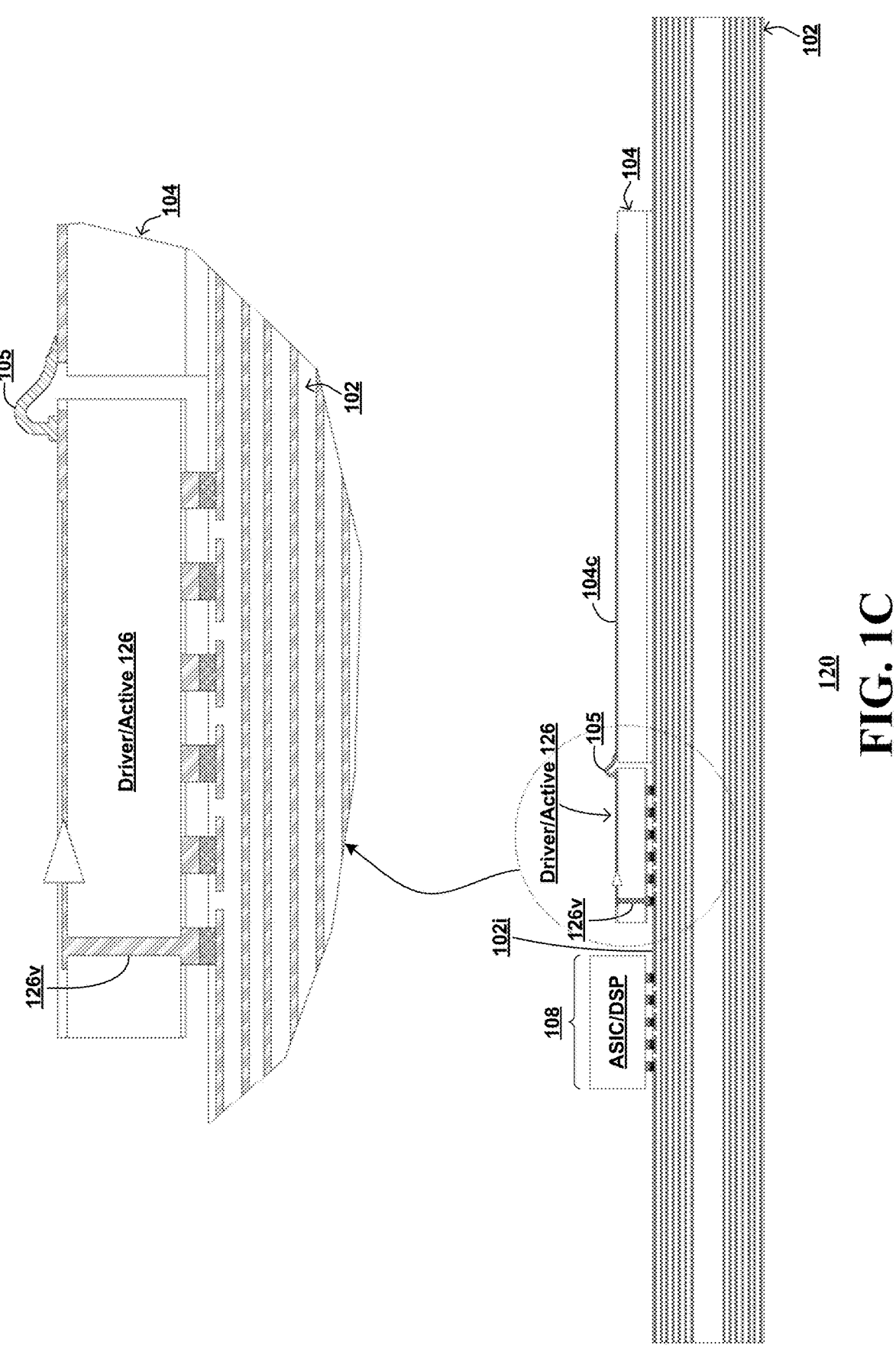
Figure 1D:
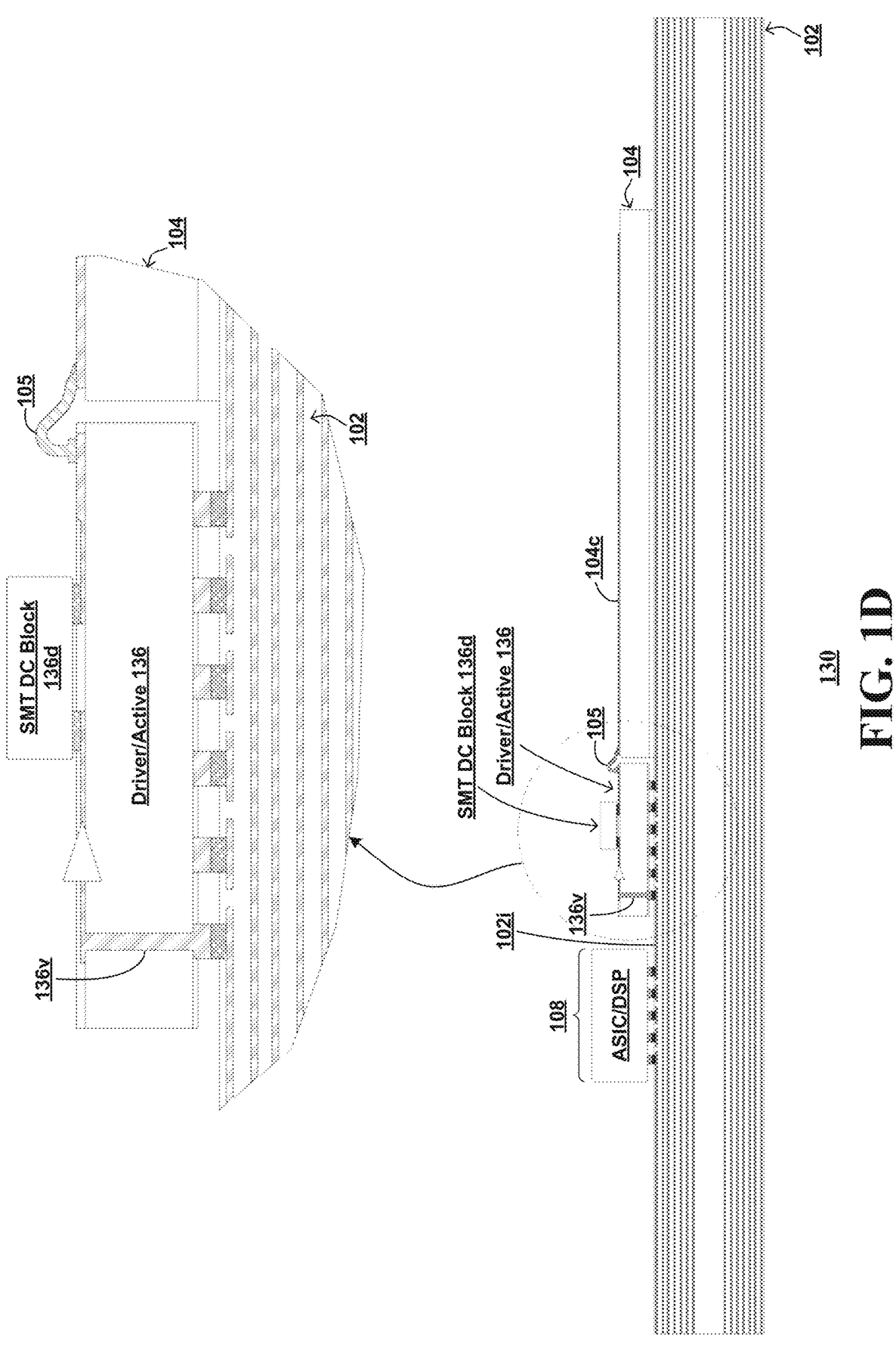

FIGS. 1B-1D are block diagrams illustrating other example, non-limiting embodiments of the system configuration in accordance with various aspects described herein. Referring to FIG. 1B, a system configuration 110 may include a riser 116 that is similar to the riser 106 of FIG. 1A—for instance, the riser 116 may be a bumped IPD with through riser via(s) 116v. However, the riser 116 may include one or more passive (e.g., surface mount) devices 116d on the top or back side redistribution layer. The system configuration 120 of FIG. 1C may include a riser 126 that is similar to the risers 106, 116, but that is in the form of a bumped active device (e.g., a BiCMOS driver, etc.). As shown, the riser 126 may include through riser via(s) 126v (on the top or back and bottom or front side of the riser 126) that couple with the active device. The system configuration 130 of FIG. 1D may include a riser 136 that is similar to the risers 106, 116, 126, but that is in the form of a bumped active device with one or more passive (e.g., surface mount) devices 136d on the top or back side redistribution layer. As shown, the riser 136 may include through riser via(s) 136v (on the top or back and bottom or front side of the riser 136) that couple with the active device and/or passive device(s) 136d.

Thus, by way of through riser via(s) in a riser, an RF interconnect 102i of the substrate 102 (e.g., driver input) can be raised toward or to a horizontal plane (e.g., driver output) of the device 104, thereby enabling short (or the shortest possible) wire bond(s) 105 such that mechanical tolerancing is not (or is less so of) a limiting factor.

It is to be understood and appreciated that a given riser may include any suitable number of through riser vias to suit the purpose and associated components in/on the riser. As some examples, a riser may include a plurality of through riser vias or channels and/or differentials (e.g., a ground-signal ground differential configuration, a ground-signal-signal-ground (GSSG) differential, etc.).

Figure 1E:
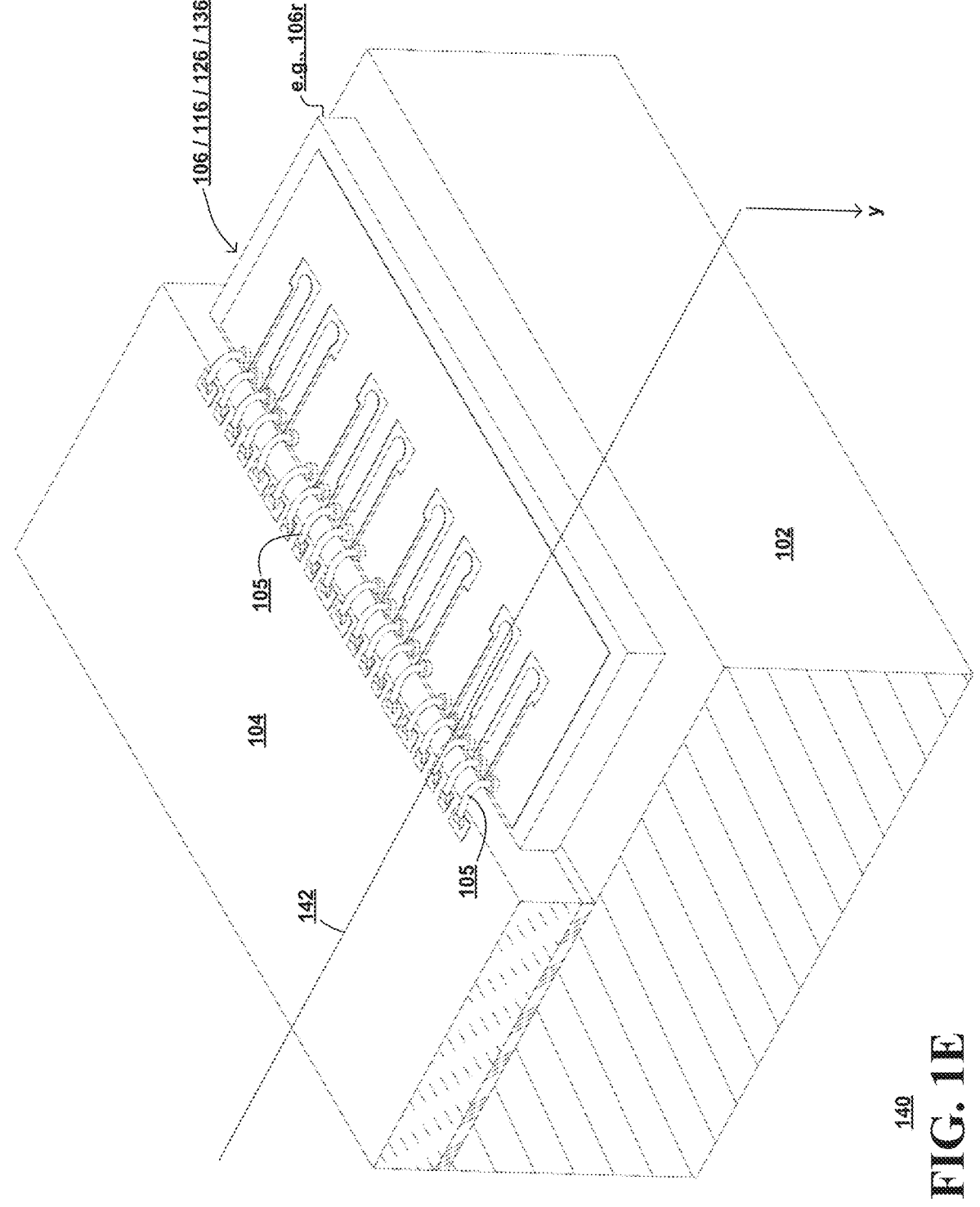
FIGS. 1E-1H are various views of an example, non-limiting embodiment of a system configuration in accordance with various aspects described herein.
Figure 1F:
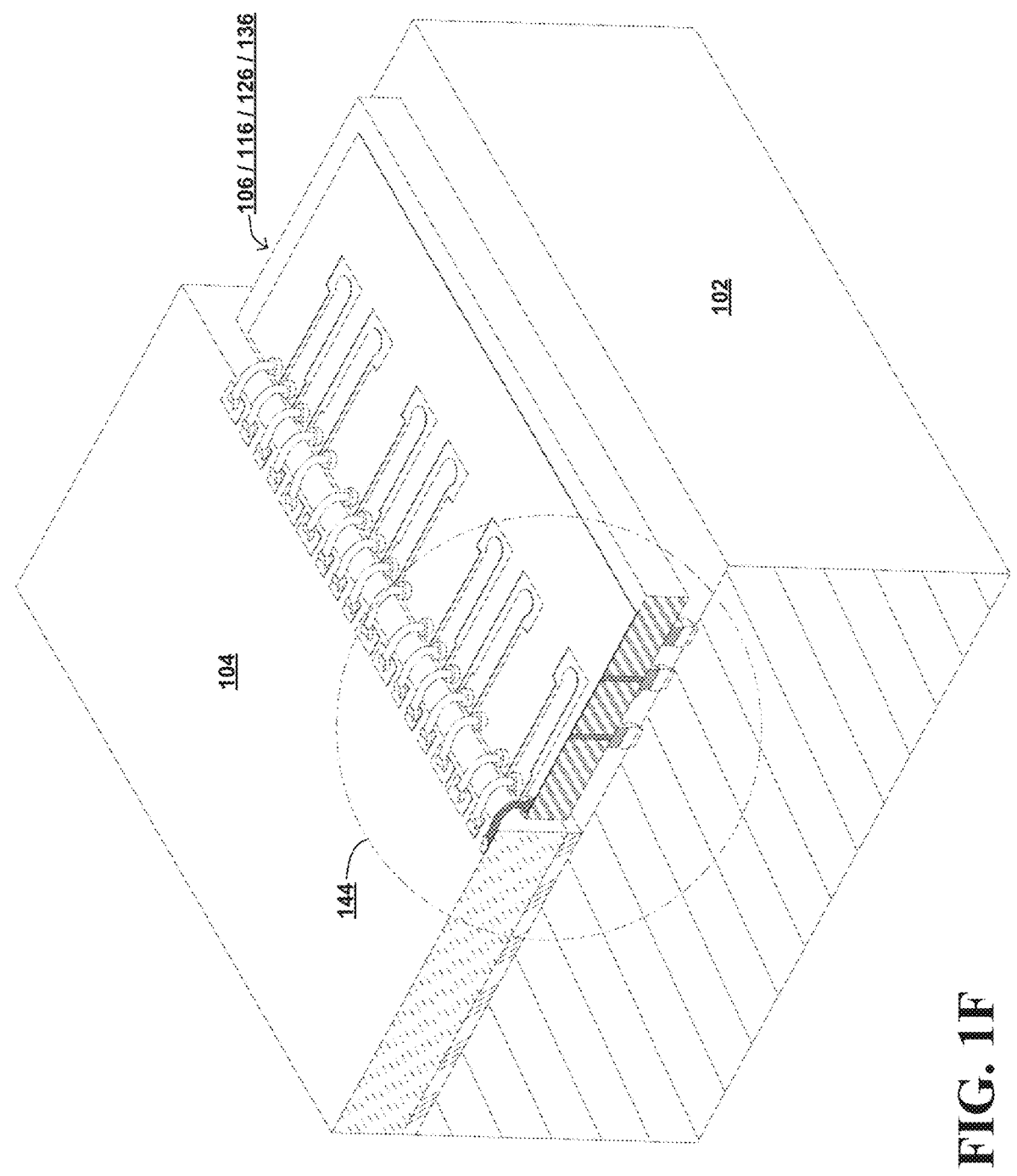
Figure 1G:
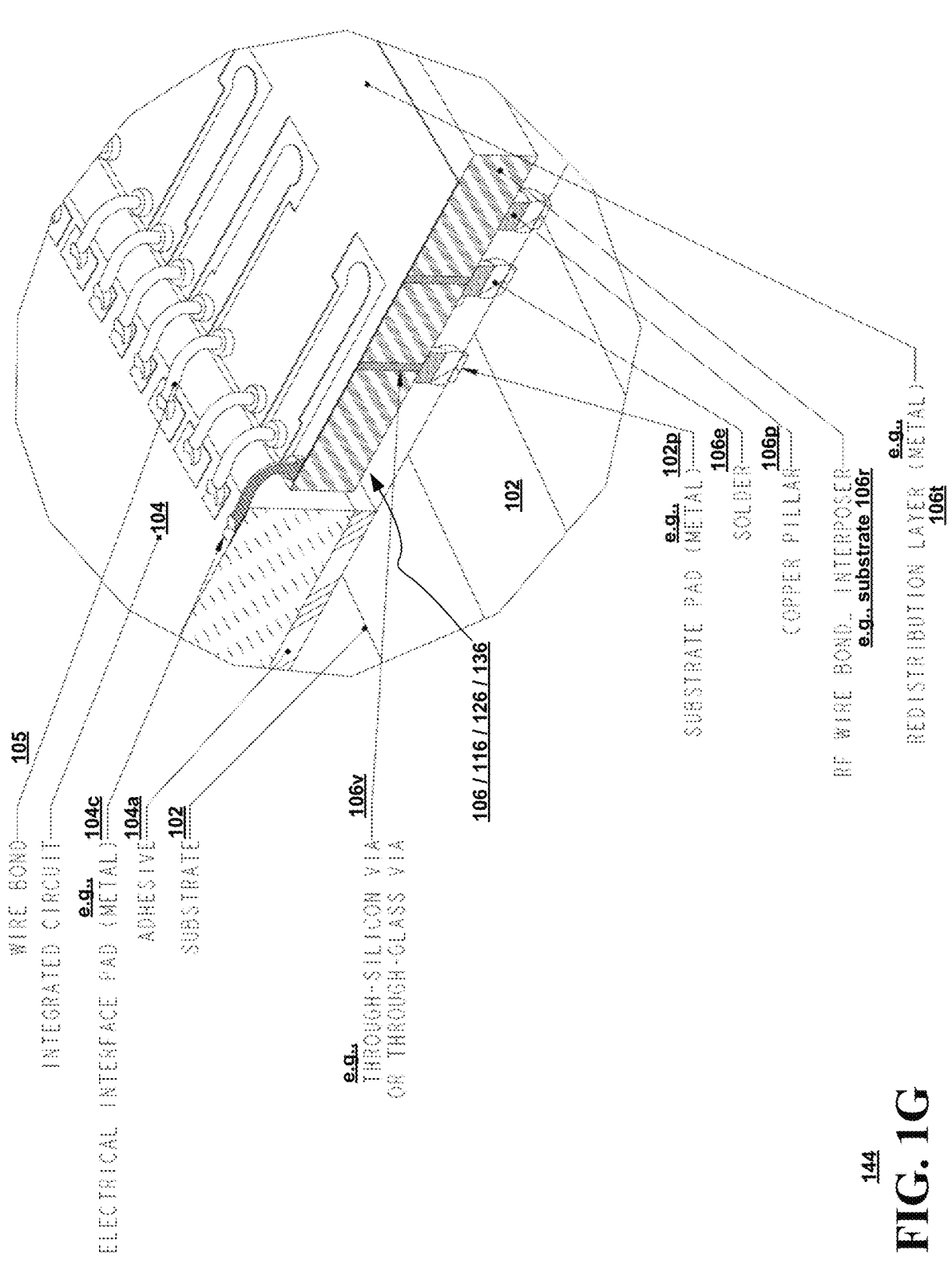
Figure 1H:
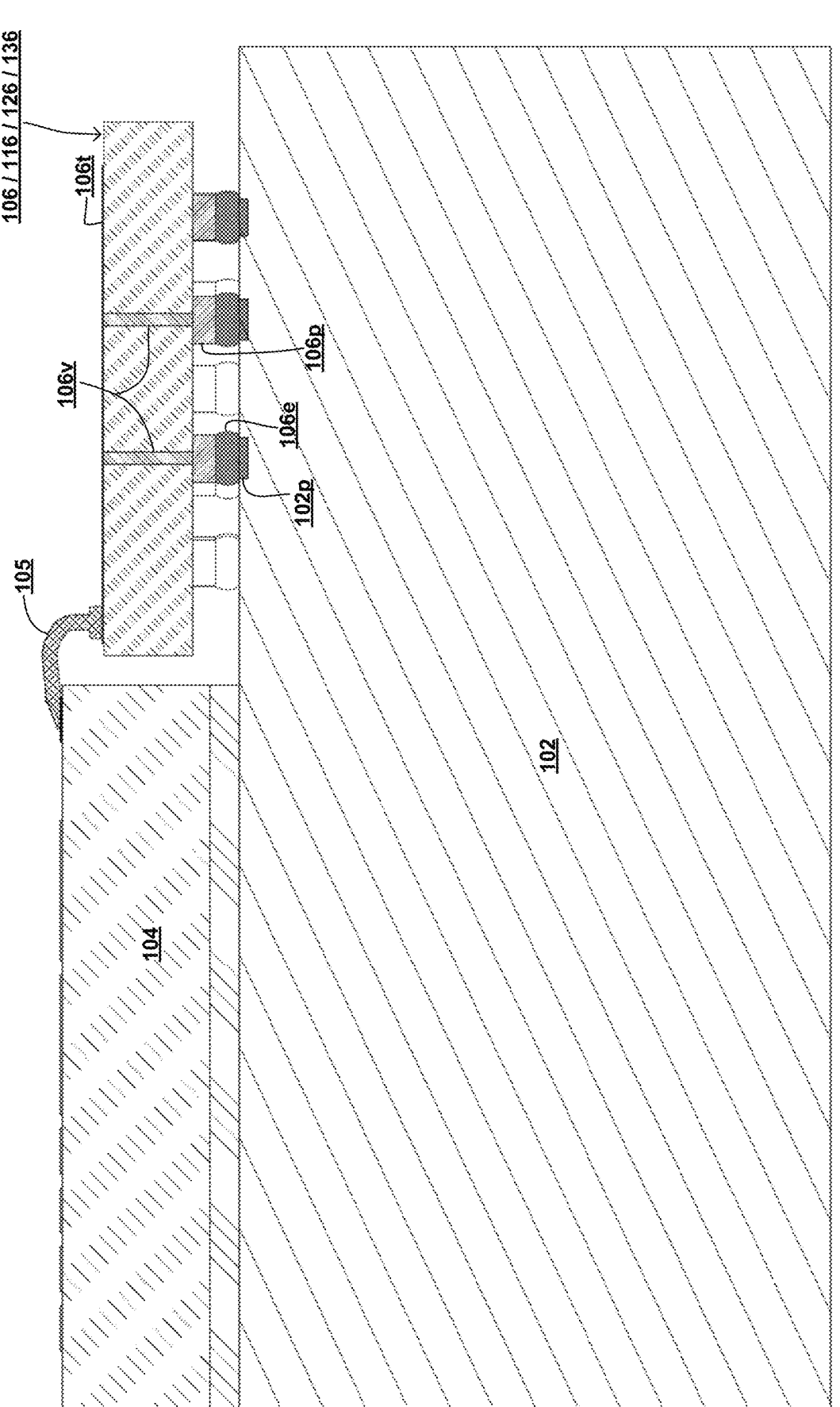

FIGS. 1E-1H are various views of an example, non-limiting embodiment of a system configuration 140 in accordance with various aspects described herein. In particular, FIG. 1E is a perspective view of the system configuration 140, FIG. 1F is a partial perspective cross-sectional view of the system configuration 140 (e.g., taken along a plane that extends from dotted line 142 of FIG. 1E in the y-direction), FIG. 1G is an expanded view of a portion 144 shown in FIG. 1F, and FIG. 1H is a cross-sectional view of the system configuration 140 (e.g., taken along a plane that extends from dotted line 142 of FIG. 1E in the y-direction). For purposes of simplicity, the descriptions of FIGS. 1E-1H are made in reference to the system configuration 100 of FIG. 1A. However, it is to be understood and appreciated that some or all of the features shown in any of FIGS. 1E-1H may apply to any of the risers 116/126/136 of system configurations 110/120/130.

As part of fabricating the riser 106, a riser substrate 106r (FIG. 1E) may be coated with a surface layering (not shown). The surface layering may be composed of polyimide and/or any other suitable type of material. In a case where the riser substrate 106r is composed of silicon, the through riser vias 106v (see FIG. 1G) may be formed or etched via lithography. Other techniques may be employed to form the through riser vias 106v if the riser substrate 106r is composed of a different type of material. For instance, where the riser substrate 106r is composed of ceramic material, the through riser vias 106v may be formed via mechanical drilling and/or the like.

Returning to the case where the riser substrate 106r is composed of silicon, the riser substrate 106r (having the surface layering thereon) may be heated so as to develop a thermal oxide that traverses all surfaces of the riser substrate 106r, including throughout the etched vias 106v. Where the riser substrate 106r is doped, and is thus semiconductive, the thermal oxide provides an insulating effect for the riser substrate 106r. The through riser vias 106v may then each be partially or fully filled with an electrically conductive material, such as copper, tungsten, aluminum, gold, and/or the like. Referring to FIGS. 1G and/or 1H, redistribution layer 106t (e.g., composed of individual copper plates, thus forming RDL 1 of copper contacts) may be aligned with the through riser vias 106v and disposed on the top surface of the riser substrate 106r so as to respectively couple with the through riser vias 106v. Portions of the redistribution layer 106t may be wire bonded (105) to electrical interface pads 104c on the device (e.g., integrated circuit) 104. The device 104 may be affixed to the substrate 102 via adhesive material 104a. Although not shown in any of FIGS. 1E-1H, redistribution layer 106b (e.g., composed of individual copper plates, thus forming RDL 2 of copper contacts) may be aligned with and coupled to the pillars 106p on the bottom surface of the riser substrate 106r. The pillars 106p may interface with the substrate 102 via solder 106e and substrate pads 102p (e.g., metal, such as copper). Although also not shown in any of FIGS. 1E-1H, differential lines may be disposed through vias within the substrate 102 and extend to a top surface of the substrate 102 so as to engage with the pillars 106p.

Figure 1I:
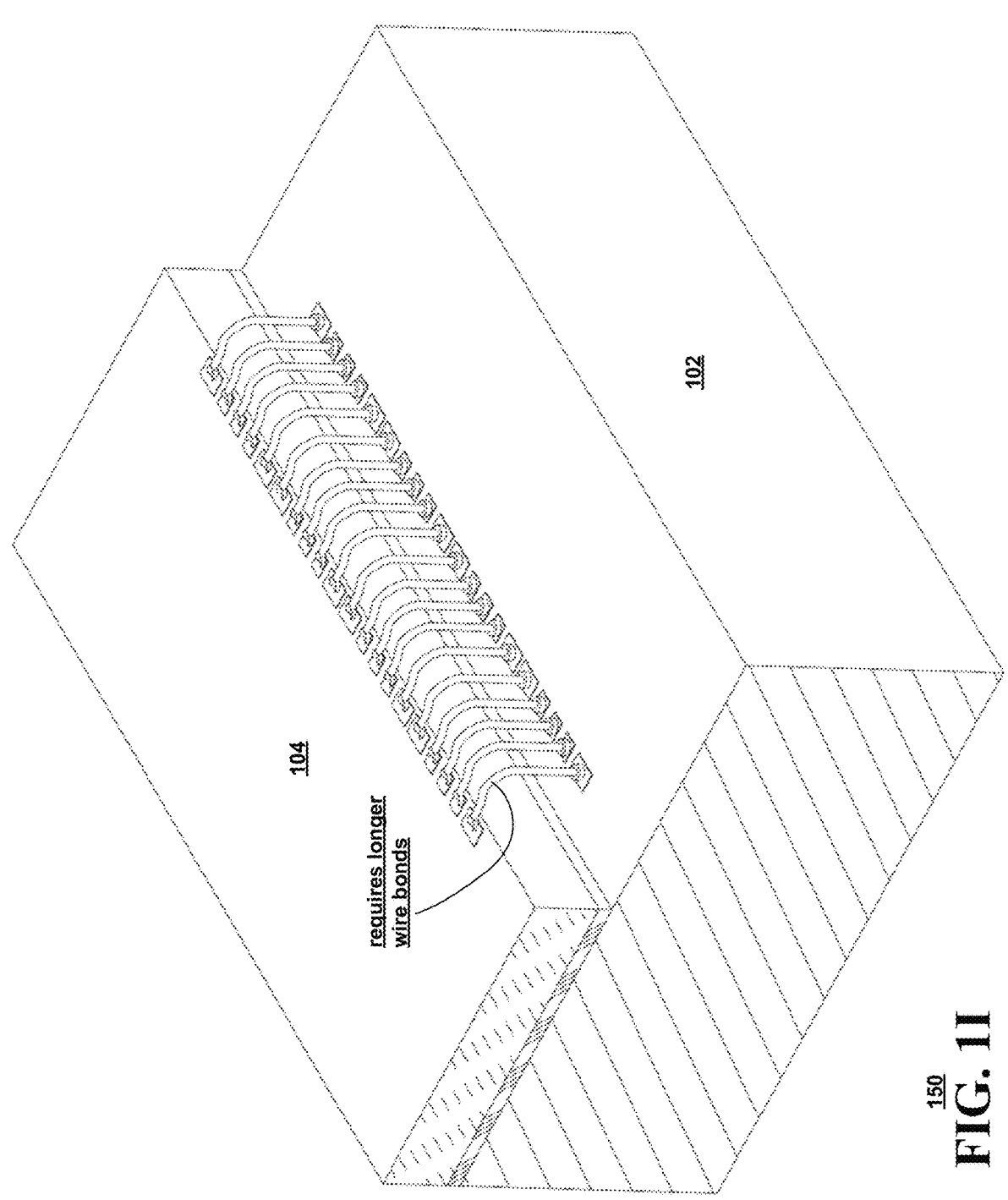
FIGS. 1I and 1J are perspective and cross-sectional views of a different system configured using wire bonding without a riser (or RF interconnect configuration), such as that as described herein.
Figure 1J:
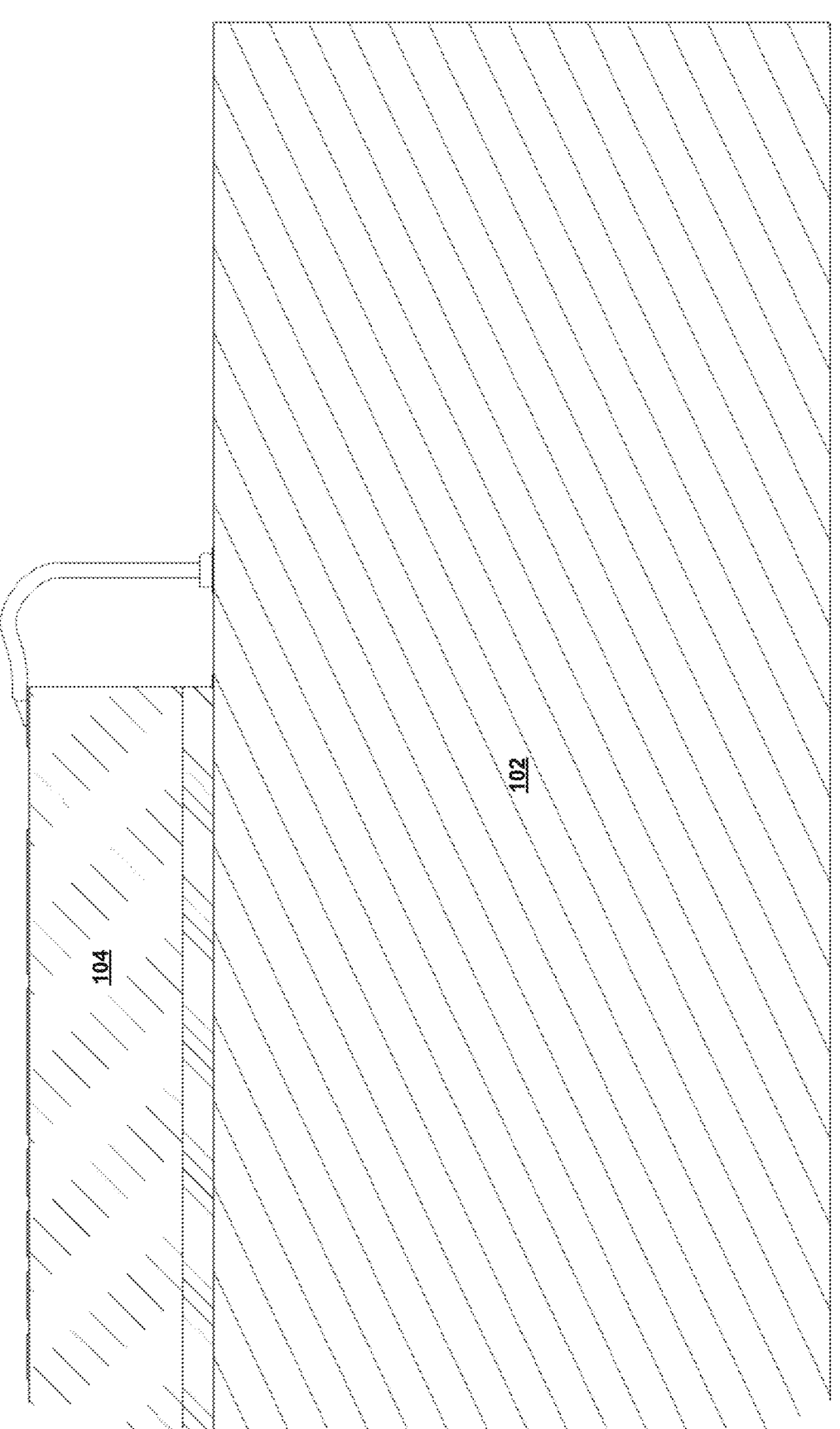

FIGS. 1I and 1J are perspective and cross-sectional views of a different system configured using wire bonding without a riser (or RF interconnect configuration), such as that as described herein. As is apparent from a visual comparison of the wire bonds 105 of FIGS. 1E and 1H with the wire bonds of FIGS. 1I and 1J, the wire bonds in the latter construction are much longer (given the lack of a riser, such as the riser 106/116/126/136), which can undesirably lead to increased inductance, thereby negatively impacting high frequency operations.

FIG. 1K illustrates different units of through riser vias in accordance with various aspects described herein. Inductance over the wire bond(s) described above with respect to any of FIGS. 1A-1H can be adjusted, or otherwise controlled, by selecting different dimensions for the through riser vias. For instance, a larger through riser via can reduce the inductance, although aspect ratio limitations apply. That is, while the diameter of a through riser via relative to a height of the riser substrate can be increased, the riser substrate itself generally cannot be made infinitely thick. To address the inductance issue, therefore, multiple through riser vias can be provided in a given riser in accordance with a minimum spacing design rule. For instance, the through riser vias may be positioned such that their centers are separated from one another by no less than a threshold distance (e.g., one times (1×) the diameter of the via, such as, for instance, 20 um). It has been shown that the addition of a second or third through riser via in a riser substrate can reduce the inductance by two times, three times, or more.

Figure 1L:
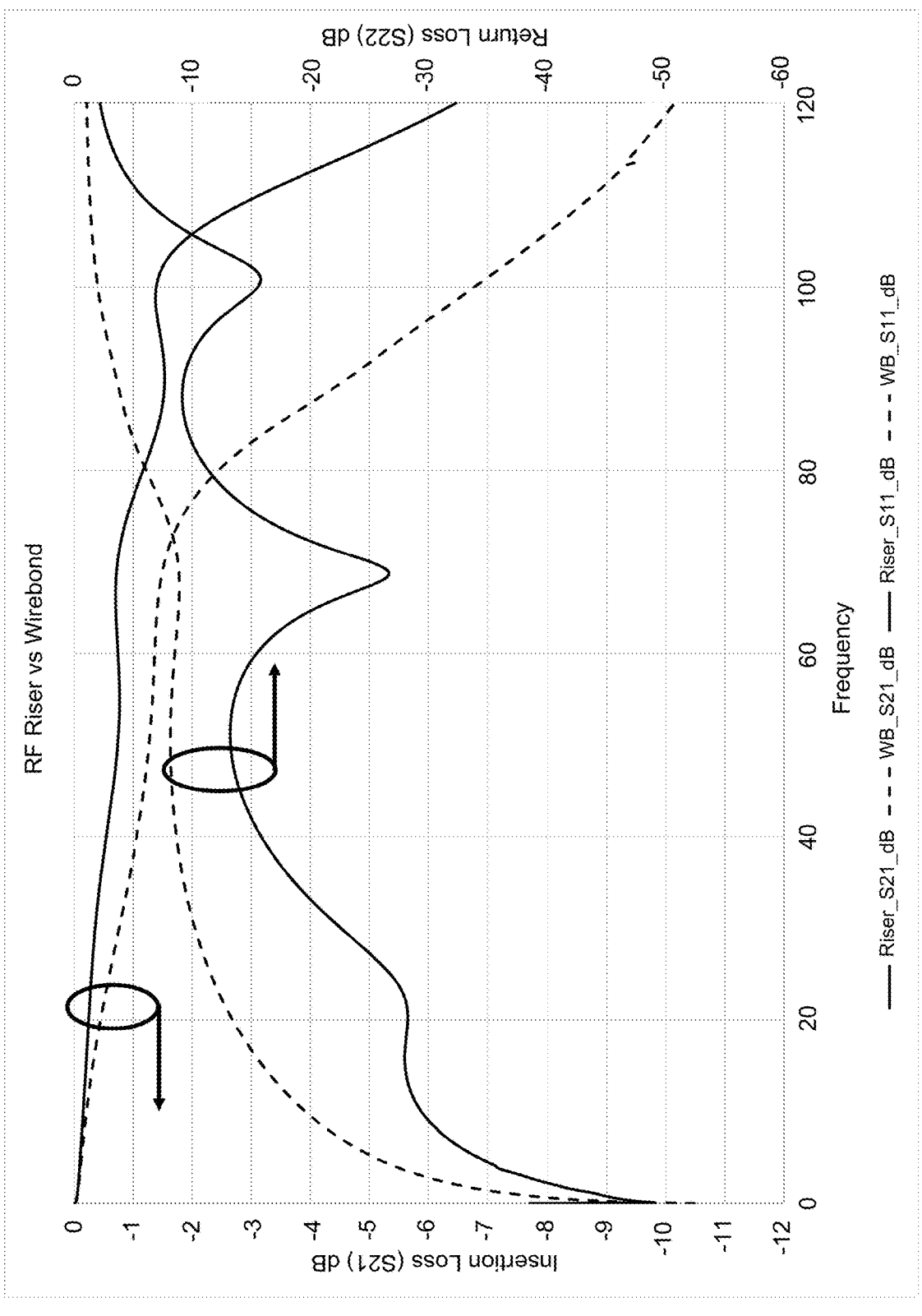
FIG. 1L is a graphical representation that illustrates various losses (across frequency) exhibited by a system configuration that employs a riser as compared to losses exhibited by a system configuration that employs traditional wire bonds without the use of such a riser.

FIG. 1L is a graphical representation that illustrates various losses (across frequency) exhibited by a system configuration that employs a riser as compared to losses exhibited by a system configuration that employs traditional wire bonds without the use of such a riser. S11, S21, S12, and S22 shown in FIG. 1L relate to a scattering matrix that represents what happens to an incoming wave, how much of that incoming wave makes it through, and how much of that incoming wave is reflected. As shown in FIG. 1L, losses across frequency are generally lower for a system configuration that employs a riser. In essence, the signal path through an organic substrate, pillars, and through riser vias to a redistribution layer (or through co-planar waveguides on a top RDL that feed into through riser vias to a bottom RDL) generally yields lower losses at up to 120 GHz data speeds. A desired interface would have ~1 dB loss (~80% power delivered) and return loss of less than –10 dB (~10% power reflected). It is to be understood and appreciated that various material systems, geometries, and wire bond lengths can be used, with a goal for as much transparency as possible, e.g., loss ~0 dB and return loss of –∞ (minus infinity).

It is to be understood and appreciated that, at frequencies above 100 GHz (or above 120 GHz), the inclusion of a riser, as described herein, can provide reduced or minimal losses so long as adjustments are made to design parameter(s) (e.g., the height difference between the riser and the optics/application specific integrated circuit (ASIC) device). Thus, it may be possible to adjust/optimize these parameter(s) to obtain improved/desired wire bond performance.

It is believed that, in a conventional configuration employing wire bonds without a riser as described herein, crosstalk with or between wire bonds is generally higher than in a configuration that utilizes such a riser. It is also believed that such a conventional configuration would not be able to support tight channel pitches whereas a configuration that utilizes a riser would.

Figure 1N:
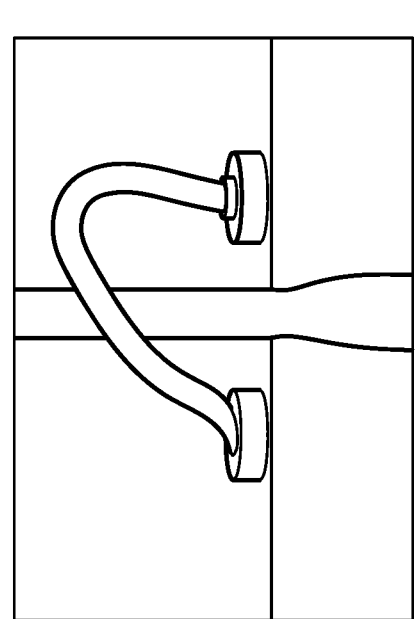
FIG. 1N illustrates an example of a ball and stitch wire bond where there is no height mismatch between two components in accordance with various aspects described herein.

In exemplary embodiments, height mismatching between a riser and a device can be adjusted or selected based on the technique to be used for wire bonding of the two components and/or based on a desired inductance over the wire bond(s). For instance, where a ball and stitch bond technique is to be employed, and thus geometric characteristics include a small ball formed on the departure bond, an optional ball on the destination bond, and a circular wire section, the dimensions of the riser may be defined such that the height of the riser is slightly lower than the height of the device when both components are positioned and coupled onto a substrate. In one or more embodiments, the difference in height between the riser and the device (where either one can be taller than the other) can be at least about 25 um. In certain embodiments, the difference in height can be at least about 100 um. Having a height mismatch may compensate for a vertical lift off required when using a ball and stitch (e.g., axisymmetric, narrow, and/or deep reaching) arc capillary wire bonder. Particularly, during wire bonding, a metal (e.g., gold) wire may pass through a hollow center of the arc capillary and may, at a tip portion of the arc capillary, be melted into a ball. The arc capillary may be struck onto a surface of the first component (e.g., the riser or the device), where an ultrasonic action may scrub the metal ball onto the riser for adhesion. The arc capillary may then be lifted off from the first component and brought over to the second component (e.g., the device or the riser). By virtue of the slight height mismatch between the two components, sufficient vertical spacing permits for the lift off of the arc capillary, thus allowing for the metal wire to form generally upwardly and then sideways. Forming a ball and stitch wire bond without such a height mismatch could risk damaging the metal wire during sideways traversal of the arc capillary from the first component to the second component. FIG. 1M illustrates example height mismatches between two components as well as corresponding resulting ball and stitch wire bonds formed using an arc capillary of particular dimensions in accordance with various aspects described herein. FIG. 1N illustrates an example of a ball and stitch wire bond where there is no height mismatch between two components in accordance with various aspects described herein. As can be seen from a comparison of the profiles of FIG. 1M and the profile of FIG. 1N, having an exact height match between the two components (and even if the wire bond is successfully formed without damage) does not necessarily provide the benefit of a shortened wire bond. In any case, the ball and stitch bond technique requires a rising phase, although the tool can be moved in either direction—rising, neutral, or dropping. Also, a "flat" short connection is generally not possible, and thus a resulting wire bond might be longer.

In a different case where a wedge bond technique is to be employed, and thus geometric characteristics include a smaller departure rectangular pad, a longer pad on the destination bond due to cutting, and a circular wire section, the dimensions of the riser may be defined such that the height of the riser is about (or exactly) equal to the height of the device when both components are positioned and coupled onto a substrate. In one or more embodiments, the difference in height between the riser and the device (where either one can be taller than the other) can be no more than about 25 um. FIG. 1O illustrates example wedge bond loop profiles and lengths and an example wedge bond tool in accordance with various aspects described herein. In terms of tool movement, there is a minimal rising phase and almost a "flat" short connection. However, the tool cannot be moved in both directions-rising or neutral, which can limit the compliance to height variability. In any case, the resulting wire bond may be shorter than in a case where a ball and stitch technique is used, although handling of a (e.g., asymmetric) wedge (or wire clamp) bonding tool may be more complex due to its larger size, its narrowness in only one direction, and the different clearance requirements on departure and destination.

FIG. 2 depicts an illustrative embodiment of a method 200 in accordance with various aspects described herein.

At 202, the method can include mounting a riser over a first portion of a substrate, the riser being configured with one or more through riser vias for coupling to an interconnect of the substrate. For example, the method may include mounting the riser 106 over a first portion of the substrate 102, the riser 106 being configured with one or more through riser vias 106v for coupling to an interconnect 102i of the substrate 102.

At 204, the method can include securing a device over a second portion of the substrate, the device having one or more conductive contacts residing in a plane of the device. For example, the method may include securing the device 104 over a second portion of the substrate 102, the device 104 having one or more conductive contacts 104c residing in a plane of the device 104.

At 206, the method can include providing one or more wire bonds that couple the one or more through riser vias with the one or more conductive contacts thereby enabling connectivity of the interconnect to be raised relative to the plane of the device such that at least one of the one or more wire bonds has a length that is less than a threshold length. For example, the method can include providing one or more wire bonds 105 that couple the one or more through riser vias 106v with the one or more conductive contacts 104c thereby enabling connectivity of the interconnect 102i to be raised relative to the plane of the device 104 such that at least one of the one or more wire bonds 105 has a length that is less than a threshold length. Because the inductance and/or capacitance associated with the wire bond(s), and thus signal loss in the system, may depend on the length(s) of the wire bond(s), in one or more embodiments, the threshold length may be based on a desired/target (e.g., reduced or minimum) signal loss amount and/or a desired/target (e.g., reduced or minimum) inductance/capacitance over a given wire bond. Further, in one or more embodiments, the riser comprises at least one of an integrated passive device or one or more passive surface mount devices. Furthermore, in one or more embodiments, the riser comprises at least one of an active device or one or more passive surface mount devices.

While for purposes of simplicity of explanation, the respective processes are shown and described as a series of blocks in FIG. 2, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

The terms "first," "second," "third," and so forth, as may be used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can involve or be practiced or associated with any type of computer system configuration, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also involve or be associated with/practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic compo-
nents without mechanical parts, the electronic components
can comprise a processor therein to execute software or
firmware that confers at least in part the functionality of the
electronic components. While various components have
been illustrated as separate components, it will be appreci-
ated that multiple components can be implemented as a
single component, or a single component can be imple-
mented as multiple components, without departing from
example embodiments.

Further, one or more embodiments can be implemented as
a method, apparatus or article of manufacture using standard
programming and/or engineering techniques to produce
software, firmware, hardware or any combination thereof to
control a computer to implement the disclosed subject
matter. The term "article of manufacture" as used herein is
intended to encompass a computer program accessible from
any computer-readable device or computer-readable storage/
communications media. For example, computer readable
storage media can include, but are not limited to, magnetic
storage devices (e.g., hard disk, floppy disk, magnetic
strips), optical disks (e.g., compact disk (CD), digital ver-
satile disk (DVD)), smart cards, and flash memory devices
(e.g., card, stick, key drive). Of course, those skilled in the
art will recognize many modifications can be made to this
configuration without departing from the scope or spirit of
the various embodiments.

In addition, the words "example" and "exemplary" are
used herein to mean serving as an instance or illustration.
Any embodiment or design described herein as "example"
or "exemplary" is not necessarily to be construed as pre-
ferred or advantageous over other embodiments or designs.
Rather, use of the word example or exemplary is intended to
present concepts in a concrete fashion. As used in this
application, the term "or" is intended to mean an inclusive
"or" rather than an exclusive "or". That is, unless specified
otherwise or clear from context, "X employs A or B" is
intended to mean any of the natural inclusive permutations.
That is, if X employs A; X employs B; or X employs both
A and B, then "X employs A or B" is satisfied under any of
the foregoing instances. In addition, the articles "a" and "an"
as used in this application and the appended claims should
generally be construed to mean "one or more" unless
specified otherwise or clear from context to be directed to a
singular form.

As may be employed herein, the term "processor" can
refer to substantially any computing processing unit or
device comprising, but not limited to comprising, single-
core processors; single-processors with software multithread
execution capability; multi-core processors; multi-core pro-
cessors with software multithread execution capability;
multi-core processors with hardware multithread technol-
ogy; parallel platforms; and parallel platforms with distrib-
uted shared memory. Additionally, a processor can refer to
an integrated circuit, an application specific integrated cir-
cuit (ASIC), a digital signal processor (DSP), a field pro-
grammable gate array (FPGA), a programmable logic con-
troller (PLC), a complex programmable logic device
(CPLD), a discrete gate or transistor logic, discrete hardware
components or any combination thereof designed to perform
the functions described herein. Processors can exploit nano-
scale architectures such as, but not limited to, molecular and
quantum-dot based transistors, switches and gates, in order
to optimize space usage or enhance performance of user
equipment. A processor can also be implemented as a
combination of computing processing units.

As may be used herein, terms such as "data storage," data
storage," "database," and substantially any other informa-
tion storage component relevant to operation and function-
ality of a component, refer to "memory components," or
entities embodied in a "memory" or components comprising
the memory. It will be appreciated that the memory com-
ponents or computer-readable storage media, described
herein can be either volatile memory or nonvolatile memory
or can include both volatile and nonvolatile memory.

What has been described above includes mere examples
of various embodiments. It is, of course, not possible to
describe every conceivable combination of components or
methodologies for purposes of describing these examples,
but one of ordinary skill in the art can recognize that many
further combinations and permutations of the present
embodiments are possible. Accordingly, the embodiments
disclosed and/or claimed herein are intended to embrace all
such alterations, modifications and variations that fall within
the spirit and scope of the appended claims. Furthermore, to
the extent that the term "includes" is used in either the
detailed description or the claims, such term is intended to
be inclusive in a manner similar to the term "comprising" as
"comprising" is interpreted when employed as a transitional
word in a claim.

In addition, a flow diagram may include a "start" and/or
"continue" indication. The "start" and "continue" indica-
tions reflect that the steps presented can optionally be
incorporated in or otherwise used in conjunction with other
routines. In this context, "start" indicates the beginning of
the first step presented and may be preceded by other
activities not specifically shown. Further, the "continue"
indication reflects that the steps presented may be performed
multiple times and/or may be succeeded by other activities
not specifically shown. Further, while a flow diagram indi-
cates a particular ordering of steps, other orderings are
likewise possible provided that the principles of causality
are maintained.

As may also be used herein, the term(s) "operably coupled
to", "coupled to", and/or "coupling" includes direct coupling
between items and/or indirect coupling between items via
one or more intervening items. Such items and intervening
items include, but are not limited to, junctions, communi-
cation paths, components, circuit elements, circuits, func-
tional blocks, and/or devices. As an example of indirect
coupling, a signal conveyed from a first item to a second
item may be modified by one or more intervening items by
modifying the form, nature or format of information in a
signal, while one or more elements of the information in the
signal are nevertheless conveyed in a manner than can be
recognized by the second item. In a further example of
indirect coupling, an action in a first item can cause a
reaction on the second item, as a result of actions and/or
reactions in one or more intervening items.

Although specific embodiments have been illustrated and
described herein, it should be appreciated that any arrange-
ment which achieves the same or similar purpose may be
substituted for the embodiments described or shown by the
subject disclosure. The subject disclosure is intended to
cover any and all adaptations or variations of various
embodiments. Combinations of the above embodiments, and
other embodiments not specifically described herein, can be
used in the subject disclosure. For instance, one or more
features from one or more embodiments can be combined
with one or more features of one or more other embodi-
ments. In one or more embodiments, features that are
positively recited can also be negatively recited and
excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A system, comprising:
a substrate having an interconnect in or on a surface of the substrate;
a riser disposed over the surface and partially over the interconnect, the riser being configured with one or more through riser vias for coupling to the interconnect, the riser having first and second ends, wherein the interconnect extends beyond the first end of the riser for coupling with one or more components;
a device positioned over the surface and adjacent to the second end of the riser, the device having one or more conductive contacts residing in a plane of the device; and
one or more wire bonds coupling the one or more through riser vias with the one or more conductive contacts thereby enabling connectivity of the interconnect to be raised toward or to the plane of the device such that at least one of the one or more wire bonds has a length that is less than a threshold length.

2. The system of claim 1, wherein the one or more components include one of a driver, a digital signal processor or an application specific integrated circuit, and wherein the riser is composed of one of:
silicon such that the one or more through riser vias comprise through silicon vias (TSVs);
glass such that the one or more through riser vias comprise through glass vias (TGVs);
ceramic such that the one or more through riser vias comprise through ceramic vias;
thin-film aluminum nitride (AlN) such that the one or more through riser vias comprise through AlN vias;
thin-film aluminum oxide (Al2O3) such that the one or more through riser vias comprise through Al2O3 vias; or
an active material or device such that the one or more through riser vias comprise vias through that active material or device.

3. The system of claim 1, wherein the device comprises a surface mount electrical-to-optical (E-O) or optical-to-electrical (O-E) transmitter or receiver, a thin-film lithium niobate (TFLN) modulator, an amplifier or an active circuit, a sensor, or a combination thereof, and wherein the substrate comprises an organic substrate or a printed circuit board (PCB).

4. The system of claim 1, wherein the interconnect comprises a radio frequency (RF) interconnect, and wherein the one or more through riser vias are composed of one or more conductive materials.

5. The system of claim 1, wherein the riser includes a redistribution layer on a top surface of the riser, wherein the redistribution layer connects a lower portion of the one or more wire bonds with an upper portion of the one or more through riser vias, and wherein the threshold length is based on a target signal loss amount, a target inductance for the at least one of the one or more wire bonds, a target capacitance for the at least one of the one or more wire bonds, or a combination thereof.

6. The system of claim 1, wherein the riser comprises at least one of an integrated passive device or one or more passive surface mount devices.

7. The system of claim 1, wherein the riser comprises at least one of an active device or one or more passive surface mount devices.

8. The system of claim 1, wherein the one or more through riser vias are defined using lithography.

9. The system of claim 1, wherein the riser comprises a first redistribution layer on an upper or back surface of the riser and a second redistribution layer residing on a lower or front surface of the riser.

10. The system of claim 9, wherein the one or more through riser vias are coupled to both the first redistribution layer and the second redistribution layer.

11. The system of claim 1, wherein the riser is configured as a bumped or ball grid array construction and includes one or more pillars for surface mounting to the substrate.

12. The system of claim 1, wherein the riser has a height that matches a height of the plane of the device.

13. The system of claim 1, wherein a difference in height between the riser and the plane of the device is less than a predefined threshold.

14. A riser, comprising:
a body having first and second ends;
one or more pillars or solder bumps on an underside of the body for facilitating mounting of the riser to a substrate; and
one or more vias defined in the body and coupled to the one or more pillars or solder bumps, wherein mounting of the riser to the substrate enables connectivity of an interconnect of the substrate to be raised toward or to a plane of a device disposed over the substrate such that a wire bond for electrical coupling of the riser and the device has a length that is less than a threshold length, wherein the body is configured for being positioned partially over the interconnect which extends beyond the first end of the riser for coupling with one or more components, and wherein the body is configured for being positioned over the substrate and adjacent to the second end of the riser.

15. The riser of claim 14, wherein the riser includes a redistribution layer on a top surface of the riser, wherein the redistribution layer connects a lower portion of the one or more wire bonds with an upper portion of the one or more through riser vias, and wherein the threshold length is based on a target signal loss amount, a target inductance for the wire bond, a target capacitance for the wire bond, or a combination thereof.

16. The riser of claim 14, wherein the riser comprises at least one of an integrated passive device or one or more passive surface mount devices.

17. The riser of claim 14, wherein the riser comprises at least one of an active device or one or more passive surface mount devices.

18. A method, comprising:
mounting a riser over a first portion of a substrate, the riser being configured with one or more through riser vias for coupling to an interconnect of the substrate, the mounting causing the riser partially over the interconnect, such that the interconnect extends beyond a first end of the riser for coupling with one or more components;

securing a device over a second portion of the substrate and adjacent to a second end of the riser, the device having one or more conductive contacts residing in a plane of the device; and providing one or more wire bonds that couple the one or more through riser vias with the one or more conductive contacts thereby enabling connectivity of the interconnect to be raised relative to the plane of the device such that at least one of the one or more wire bonds has a length that is less than a threshold length.

19. The method of claim 18, further comprising defining the one or more through riser vias in the riser using lithography, wherein the riser includes a redistribution layer on a top surface of the riser, wherein the redistribution layer connects a lower portion of the one or more wire bonds with an upper portion of the one or more through riser vias.

20. The method of claim 18, wherein the threshold length is based on a target signal loss amount, a target inductance for the at least one of the one or more wire bonds, a target capacitance for the at least one of the one or more wire bonds, or a combination thereof.

\* \* \* \* \*